(12) United States Patent
Bruchmann

(10) Patent No.: US 6,472,878 B1
(45) Date of Patent: Oct. 29, 2002

(54) CURRENT MEASURING ELEMENT WITH A HALL SENSOR

(76) Inventor: Klaus Bruchmann, Am Ölberg 7a, Coburg 96450 (DE)

( * ) Notice: Subject to any disclaimer, the term of this patent is extended or adjusted under 35 U.S.C. 154(b) by 0 days.

(21) Appl. No.: 09/508,953

(22) PCT Filed: Sep. 17, 1998

(86) PCT No.: PCT/EP98/05912

§ 371 (c)(1),
(2), (4) Date: Mar. 17, 2000

(87) PCT Pub. No.: WO99/15907

PCT Pub. Date: Apr. 1, 1999

(30) Foreign Application Priority Data

Sep. 19, 1997 (DE) .......................... 197 41 417

(51) Int. Cl.[7] ........................................... G01R 31/327
(52) U.S. Cl. .................... 324/424; 324/127; 324/158.1; 324/117 H; 324/117 R
(58) Field of Search .......................... 324/76, 127, 522, 324/158.1, 424, 117 H, 117 R, 251, 252, 116; 340/664; 361/42; 703/42; 307/309

(56) References Cited

U.S. PATENT DOCUMENTS

| | | | |
|---|---|---|---|
| 4,728,887 A | * | 3/1988 | Murray |
| 4,864,223 A | * | 9/1989 | Andreas |
| 5,111,221 A | * | 5/1992 | Tomas |
| 5,610,512 A | | 3/1997 | Selcuk |
| 5,642,041 A | | 6/1997 | Berkcan |
| 5,734,264 A | * | 3/1998 | Michel |
| 5,795,631 A | * | 8/1998 | Naum |
| 5,917,316 A | * | 6/1999 | Antonio |

FOREIGN PATENT DOCUMENTS

| | | |
|---|---|---|
| DE | 34 28 392 A1 | 2/1986 |
| DE | G91 13 081.6 U | 1/1992 |
| DE | 195 49 181 A1 | 7/1997 |
| EP | 0 578 948 A1 | 1/1994 |
| EP | 0 675 368 A1 | 10/1995 |

* cited by examiner

Primary Examiner—Michael Sherry
Assistant Examiner—Trung Nguyen
(74) Attorney, Agent, or Firm—Wood, Phillips, Katz, Clark & Mortimer

(57) ABSTRACT

A current measuring element comprising a current carrying conductor having the shape of a flat rail in an insulating housing and a hall sensor which is arranged in the proximity of said conductor. The current carrying conductor is bent to form a unshaped conductor loop in the area of the hall sensor and the hall sensor is situated on a board which is arranged in the unshaped conductor loop. The board containing the hall sensor is placed upon a main board on which the signal from the hall sensor is processed. An insulating cover provided for the housing is arranged between the housing containing the current carrying conductor and the main board. The cover comprises an insulating compartment which extends inside the conductor loop and receives the board containing the hall sensor.

7 Claims, 3 Drawing Sheets

CURRENT MEASURING ELEMENT WITH A HALL SENSOR

TECHNICAL FIELD

The invention relates to a current measuring device having a current carrying conductor in an insulating housing and a Hall sensor arranged in the vicinity of the conductor. Such a current measuring device is described in EP 0 538 658 A1, for example.

BACKGROUND OF THE INVENTION

Hall sensors can be used to measure the current flowing in a conductor without making contact, as is known. To concentrate the magnetic field of the current, which is responsible for the Hall effect, and to exclude interfering influences, it is general practice to use ferromagnetic elements having a clearance which contains the Hall sensor.

In the current measuring device which is described in the aforementioned document EP 0 538 658 and can be used in power switches and motor protective circuit breakers, the current flows through a coil which is split into two halves and whose common coil former is provided with a pocket for holding the integrated Hall circuit.

DE-A-34 28 392 discloses a similar current measuring device in which a current carrying conductor in the form of a coil or a bent rail surrounds a Hall sensor and is itself surrounded by a ferromagnetic core to concentrate the magnetic field.

Such embodiments of the current measuring device with coils and ferromagnetic cores and the like have the disadvantage that the coils and cores make the structure very large and heavy.

DE-A-195 49 181 discloses a current measuring device in which a Hall sensor is inserted between the limbs of a U-shaped conductor loop, without a ferromagnetic core being connected in between. This measuring device has no shield, however, and is therefore relatively inaccurate and is not suitable for measuring heavy currents, at least.

SUMMARY OF THE INVENTION

The invention is based on the object of refining the current measuring device such that it is of simple design, is small and lightweight and can thus be used universally.

The invention achieves this object with the features specified in patent claim 1. Advantageous refinements of the current measuring device according to the invention are specified in the subclaims.

Dispensing with a coil and a ferromagnetic core or another ferromagnetic element not only simplifies the design of the current measuring device, but also means that significantly less heat is produced during operation on account of the fact that transfer losses no longer occur. This is of considerable importance particularly for use in switchboxes.

The two current paths, carrying flow in opposite directions parallel to one another, in the U-shaped conductor loop comprising flat busbars cause the magnetic field, and hence the signal from the Hall sensor, to be virtually doubled.

The current measuring device according to the invention for measuring current without making contact is so small that it can easily be incorporated in measuring boxes and switching devices. The current measuring device according to the invention already integrates the electronics for amplifying and evaluating the measured signal, a temperature compensation means and possibly a control logic unit and a digital display.

The fully closed, insulating cover between the housing with the current carrying conductor and the circuit board with the Hall sensors and the evaluation electronics ensures complete DC isolation of the high-voltage region from the electronic components.

The optionally provided metallic shield around the U-shaped conductor loop reduces the influence of interfering magnetic fields on the Hall sensor.

BRIEF DESCRIPTION OF THE DRAWINGS

The invention's current measuring device with a Hall sensor is explained in more detail below by way of example with the aid of the drawing, in which.

DETAILED DESCRIPTION OF PREFERRED EMBODIMENTS

Figure 1:
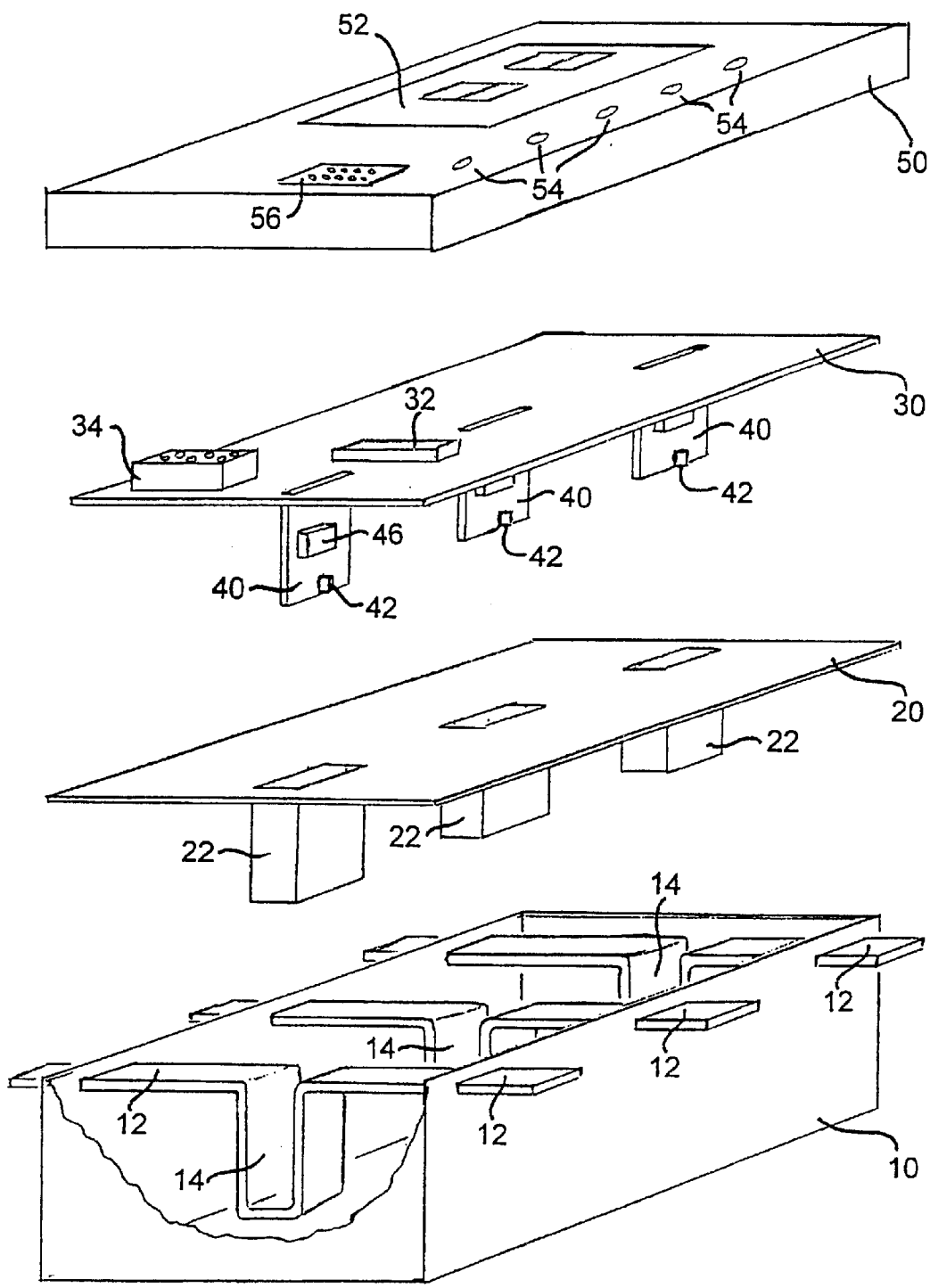
FIG. 1 shows the structure of the current measuring device.

FIG. 1 shows the structure of the current measuring device in an exploded view. The current measuring device comprises an insulating housing 10 for one or more current carrying conductors 12 in the form of flat rails of the type conventional in power engineering. The housing 10 shown in FIG. 1 comprises three conductors 12 running in parallel for the three-phase supply of current to a load, e.g. a motor.

The current measuring device shown is provided for use in the low-voltage/heavy-current field with current levels of up to approximately 150 A. The lowest current level which the measuring device is designed to record is between 0.1 and 1 A.

At the input and at the output of the housing 10, the conductors 12 are provided with connection elements (not shown) so that each of the conductors 12 can be connected into the corresponding power supply line. The insulating covering, on the input side and the output side, for the conductors 12 and the connection elements is likewise not shown.

In the housing 10, each of the flat, rail-like conductors 12 is bent in a U shape so that a conductor loop 14 which is open at the top is produced. The U-shaped conductor loop 14 extends downward out of the plane of the flat conductor 12, that is to say it is not situated in the plane of the flat conductor 12, but rather runs perpendicular to it. If the width of the current conductor rail 12 is 12 mm, the conductor loop 14 has, by way of example, a depth of approximately 15 mm and an internal spacing between the limbs of the U of approximately 5 to 8 mm.

Each of the U-shaped conductor loops 14 can be surrounded on the outside, that is to say in the region of the housing 10 below the conductor 12 and the conductor loop 14, by a metallic shield (not shown) which reduces or eliminates the influence of interfering external magnetic fields on current measurement. The shield is preferably made of soft iron (Mu metal); however, for particular applications, a quite ordinary iron sheet can suffice to achieve the desired shielding effect.

A cover 20 made of insulating material is mounted on top of the housing 10. The cover 20 seals off the housing 10 with the current carrying conductors 12 so that they are protected from accidental contact.

The cover 20 is provided with pockets 22, which are likewise made of insulating material, in the region of the conductor loops 14. The pockets 22 project downward from the cover 20 and are each situated within the conductor loops 14 when the cover 20 is mounted. The pockets 22 are open at the top at the level of the main plane of the cover 20, but are closed on all sides at the bottom in the region of the conductor loop 14. The width of each pocket 22 corresponds fairly accurately to the limb spacing of the conductor loop 14, so that the outer sides of the pocket 22 are at only a short distance from the lateral limbs of the conductor loop 14, or else even bear against the latter. The depth of the pockets 22 is less than the depth of the conductor loop 14. The length of the pockets 22 (in the direction of the width of the conductor rail 12) can be greater, the same as or less than the width of the conductor rails 12.

Above the cover 20, there is a main circuit board 30. The main circuit board 30 rests removably on the cover 20 with a small spacing.

Perpendicular to the main plane of the main circuit board 30, small circuit boards 40 are mounted on the main circuit board 30 and are arranged such that they extend into the pockets 22 of the cover 20 when the main circuit board 30 is mounted on the cover 20.

Figure 2:
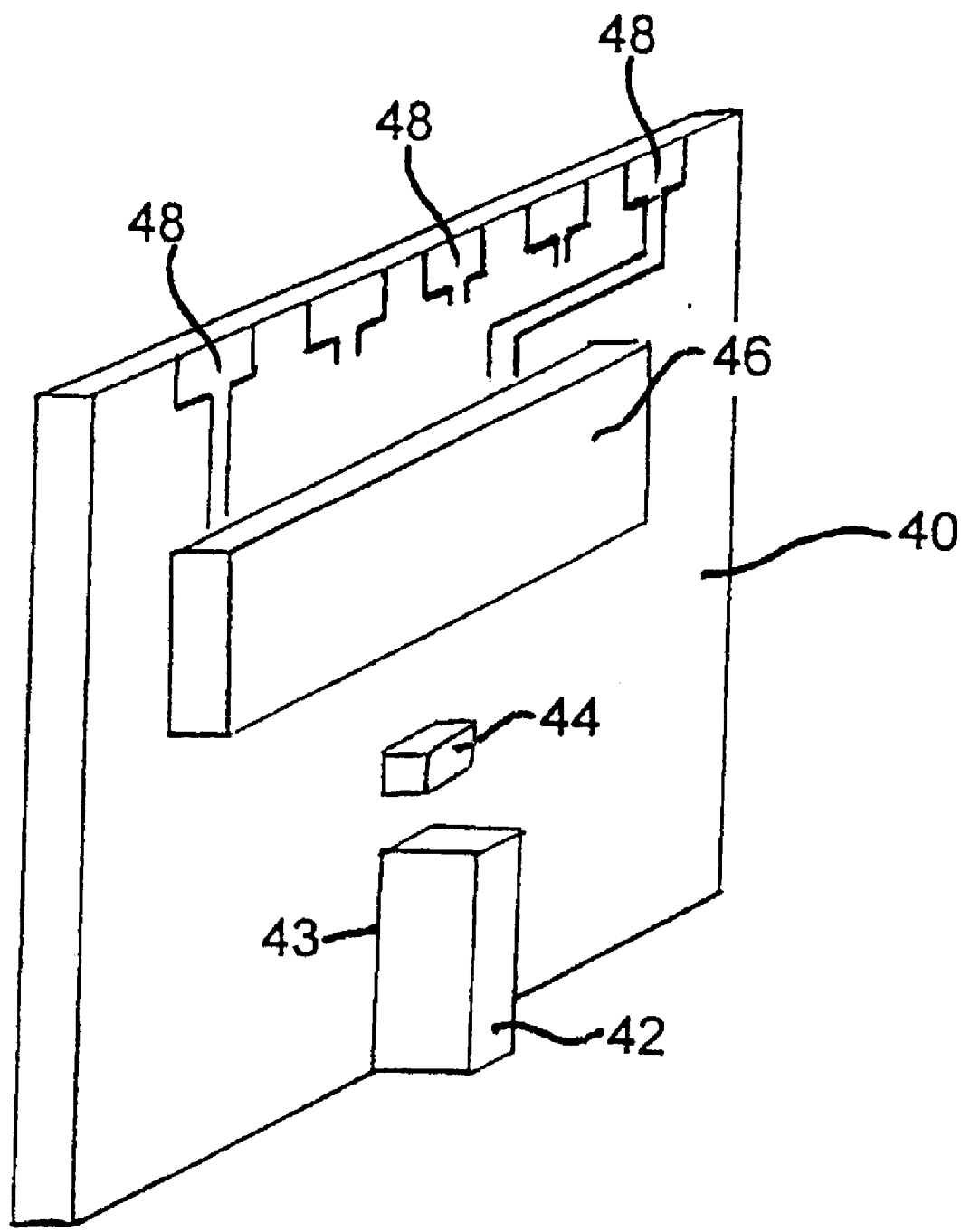
FIG. 2 shows the circuit board with the Hall sensor in detail.

Hall sensors 42 are mounted on the small circuit boards 40. As FIG. 2 shows, the Hall sensors 42 are fitted in indentations 43 approximately in the center of the bottom, free side or edge of the small circuit boards 40 such that the Hall sensors 42 are located centrally in the pockets 22 of the cover 20 and approximately centrally in the current loops 14 when the circuit board 30, the cover 20 and the housing 10 are assembled. In this arrangement, the Hall sensors 42 are arranged such that the magnetic field of the current loop 14 permeates the Hall element in the Hall sensors 42 perpendicularly. The main plane of the Hall sensor 42 thus runs perpendicular to the main plane of the small circuit board 40. The indentation 43, matching the Hall sensor 42 exactly, in the bottom of the circuit board 40 simplifies correct placement of the Hall sensor 42 and ensures that the Hall sensor 42 maintains its position.

In the immediate vicinity of the Hall sensor 42, the circuit board 40 is provided with a temperature sensor 44, for example an NTC temperature sensor. In addition, an amplifier 46 which amplifies the signal from the Hall sensor 42 is located on the circuit board 40. The amplified signals from the Hall sensor 42 and the signals from the temperature sensor 44 are passed to the main circuit board 30 via conductor tracks 48.

The signals from the Hall sensors 42 and the signals from the temperature sensors 44 are processed further on the main circuit board 30. To this end, the necessary electrical and electronic components are arranged on the main circuit board 30, for example integrated circuits 32, resistors, diodes, relays etc. (only some of which are shown in FIG. 1). The main circuit board 30 preferably includes a microprocessor.

The signal from the temperature sensor 44 is used to provide temperature compensation for the signal from the Hall sensor 42. Since the temperature sensor 44 is situated in the immediate vicinity of the Hall sensor 42, its temperature is recorded very accurately. The temperature-corrected signal from the Hall sensor 42 can be used to determine the current flowing in the conductor 12 accurately.

Above the main circuit board 30 with the small circuit boards 40 there is a covering 50. The front (the outer side) of the covering 50 has an LCD display 52, buttons 54 for entering commands, variables etc. and connectors 56 for external connections. The covering 50 is electrically connected to the main circuit board 30 via internal connectors 34 on the main circuit board and/or via cables.

The buttons 54 can be used to set the microprocessor on the main circuit board 30 to particular modes of operation using menu control. Thus, for example, the LCD display can alternately show the currents in the individual phase lines, the (total) power supplied and other variables, such as nominal and actual values. By specifying nominal values for current and time, the current measuring device can also be used as a protective circuit breaker, with turn-off commands and the like being picked up via the external connectors 56. The main circuit board 30 can also contain relays and control terminals which condition and pass on the switching signals.

Figure 3:
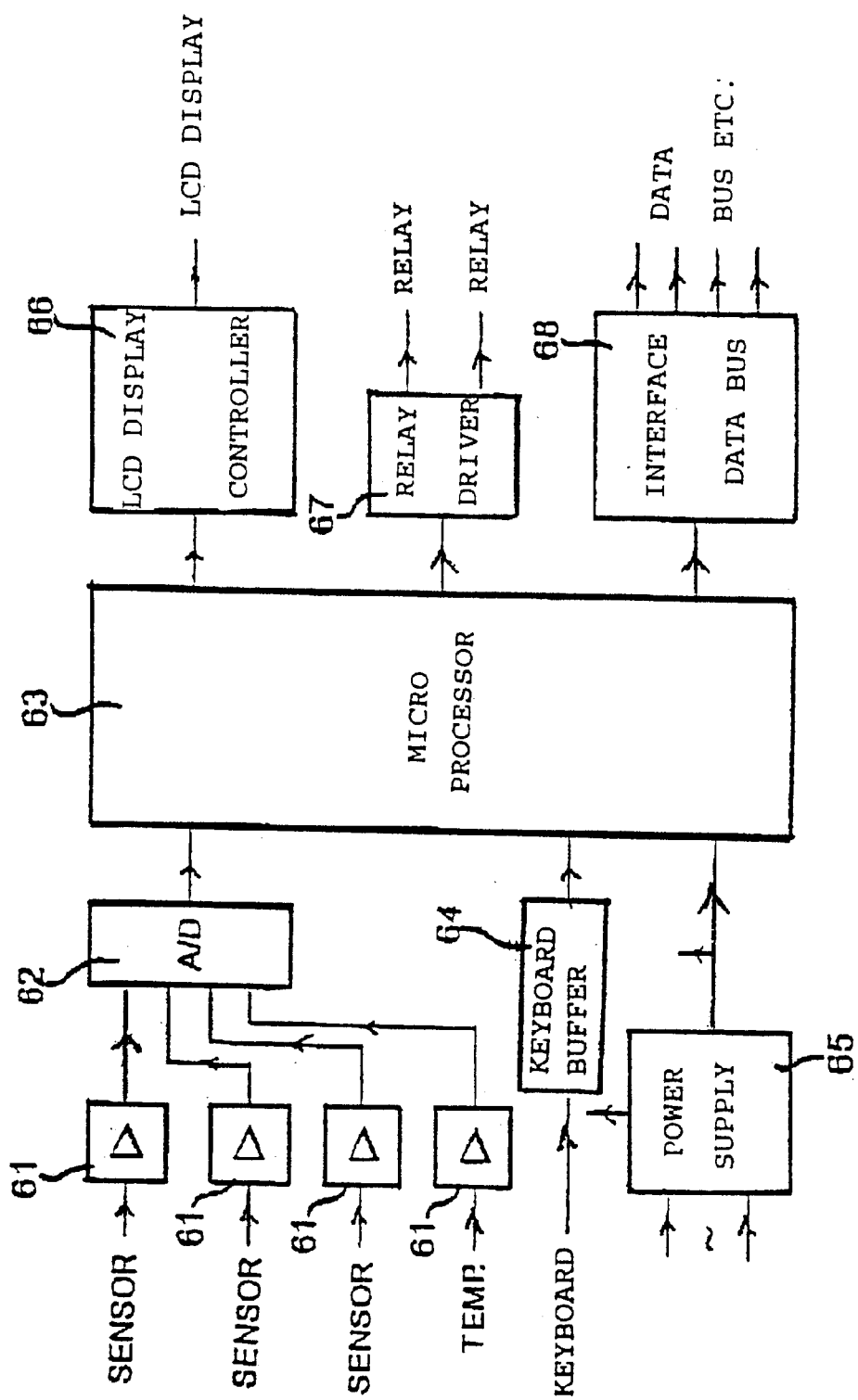
FIG. 3 shows a block circuit diagram for signal processing in the current measuring device.

FIG. 3 shows a block circuit diagram for the electronic components of the current measuring device. The schematic illustration in FIG. 3 summarizes the processing of the signals from the Hall sensors 42 and the temperature sensors 44, of the input signals from the buttons 54 and the connector 56 and of the output signals to the LCD display 52, the connector 56 etc. Signal processing is carried out not only on the main circuit board 30, but also, in part, on the small circuit boards 40 with the Hall sensors 42 and, if applicable, other components, not arranged on the main circuit board 30, for example in the LCD display block 52 on the covering 50.

As FIG. 3 shows, the current signals from the Hall sensors 42 and the temperature sensor(s) 44 are amplified in amplifiers 61 and are passed to an A/D converter 62. From the A/D converter 62, the signals go on to a microprocessor 63. The input signals for the microprocessor 63 also include the "keyboard" signals supplied via a keyboard buffer 64. These "keyboard" signals are the control and monitoring signals which are input externally using the buttons 54 and/or the connector 56, define in which mode the microprocessor 63 is intended to operate and which can be used, within the individual modes, to stipulate, by way of example, nominal values for the current, limit values and the like.

The programs which the microprocessor 63 uses to operate in the individual operating modes are stored either in the microprocessor 63 itself or in separate read only memories (not shown).

A power supply 65 supplies the electronic components with the necessary power.

The input signals are processed in the microprocessor 63 on the basis of the respective mode of operation and on the basis of the respective stipulations. Depending on the result of the processing and on the mode of operation, the microprocessor 63 then outputs control signals for the LCD display 52 to an LCD display controller 66, switching signals to a relay drive unit 67 and/or data of any type to an interface 68 for passing on the data externally on a data bus, for example.

By way of example, if the current measuring device is in a motor protective mode, the relay drive unit 67 can be used for directly switching relays (not shown) which interrupt the power supply to the motor under particular conditions (for example a high current over an excessively long time). In addition, or as an alternative, an alarm can be triggered, the excessively high current or the turning-off of a central control location can be reported, and other such aspects.

What is claimed is:

1. A current measuring device comprising:
   a current carrying conductor in an insulating housing; and
   a Hall sensor arranged in the vicinity of the conductor, in which
   the current carrying conductor is a flat rail which is bent, in the region of the Hall sensor, into a U-shaped loop surrounded by a metallic shield against magnetic fields, and the Hall sensor is located on a circuit board which is arranged in the U-shaped conductor loop, wherein the circuit board with the Hall sensor is fitted on a main circuit board on which the signal from the Hall sensor is processed, and wherein an insulating cover for the housing is arranged between the housing with the current carrying conductor and the main circuit board, said cover having an insulating pocket which extends into the conductor loop and holds the circuit board with the Hall sensor.

2. The current measuring device as claimed in claim 1, wherein a covering having a display of the current flowing through the conductor is fitted above the main circuit board.

3. The current measuring device as claimed in claim 1, wherein, on the free side of the circuit board extending into the conductor loop, there is an indentation into which the Hall sensor is inserted perpendicularly to the main plane of the circuit board.

4. The current measuring device as claimed in claim 1, wherein a temperature sensor is fitted on the circuit board in the immediate vicinity of the Hall sensor.

5. A current measuring device comprising:

a current carrying conductor in an insulating housing and a Hall sensor arranged in the vicinity of the conductor, the current carrying conductor being a flat rail which is bent into a U-shaped conductor loop;

a main circuit board and an insulating cover, wherein said main circuit board, said insulating cover and said insulating housing are configured to be assembled together, wherein the Hall sensor is carried by the main circuit board on which the signal from the Hall sensor is processed, said Hall sensor is arranged to extend into said U-shaped loop when said main circuit board is assembled with said housing, and wherein said insulating cover for the insulating housing includes a base portion arranged between the insulating housing and the main circuit board, and an insulating pocket which extends from the base portion; and when said cover is assembled with said housing, said pocket projects into the conductor loop and when said main circuit board is assembled with said housing said Hall sensor projects into said pocket, said pocket surrounding the Hall sensor to insulate said Hall sensor from said conductor loop.

6. The current measuring device as claimed in claim 5, wherein the Hall sensor is insulated from the U-shaped conductor by the pocket without an interposed ferromagnetic core between the Hall sensor and the conductor loop.

7. The current measuring device as claimed in claim 5, wherein said Hall sensor is carried on a sensor circuit board which is fitted on the main circuit board and extends perpendicularly thereto.

* * * * *